United States Patent
Ning et al.

(10) Patent No.: US 10,008,281 B2
(45) Date of Patent: Jun. 26, 2018

(54) ONE TIME PROGRAMMABLE READ-ONLY MEMORY (ROM) IN SOI CMOS

(71) Applicant: International Business Machines Corporation, Armonk, NY (US)

(72) Inventors: Tak H. Ning, Yorktown Heights, NY (US); Ghavam G. Shahidi, Pound Ridge, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/487,008

(22) Filed: Apr. 13, 2017

(65) Prior Publication Data

US 2018/0102179 A1 Apr. 12, 2018

Related U.S. Application Data

(62) Division of application No. 15/287,241, filed on Oct. 6, 2016, now Pat. No. 9,704,569.

(51) Int. Cl.
*G11C 16/04* (2006.01)
*G11C 17/18* (2006.01)
(Continued)

(52) U.S. Cl.
CPC ............. *G11C 17/18* (2013.01); *G11C 17/16* (2013.01); *H01L 27/092* (2013.01); *H01L 29/0649* (2013.01); *H01L 29/7841* (2013.01)

(58) Field of Classification Search
CPC ....... G11C 17/18; G11C 17/16; H01L 27/092; H01L 29/0649; H01L 29/7841
See application file for complete search history.

(56) References Cited

U.S. PATENT DOCUMENTS 5,614,433 A * 3/1997 Mandelman ........ H01L 27/0922
148/DIG. 150
5,942,781 A * 8/1999 Burr .................... H01L 23/528
257/347

(Continued)

FOREIGN PATENT DOCUMENTS

JP 2008098467 A 4/2008

OTHER PUBLICATIONS

Hsu et al., "A High Speed, Low Power P-Channel Flash EEPROM Using Silicon Rich Oxide as Tunneling Dielectric", Extended Abstracts of the 1992 International Conference on Solid State Devices and Materials, Tsukuba, Aug. 26-Aug. 28, 1992, pp. 140-142.

(Continued)

*Primary Examiner* — Pho M Luu
(74) *Attorney, Agent, or Firm* — Scully, Scott, Murphy & Presser, P.C.; Louis Percello, Esq.

(57) ABSTRACT

A method of operating a programmable read-only-memory (ROM) cell unit having a series coupled CMOS NFET and CMOS PFET device formed on a semiconductor layer located on top of a buried dielectric layer, the buried dielectric layer formed on top of a cell substrate, and each NFET and PFET device having a respective gate, drain and source terminals. The method includes applying a first bias voltage to the cell substrate; and applying a second bias voltage to a drain terminal of the PFET device with respect to a source of the PFET, the second bias voltage sufficient to enable electron trapping at the buried dielectric layer associated with that cell, the injected electron carriers trapped at the buried dielectric layer providing a stored charge representative of a logic bit value at the unit cell that is physically undetectable and is configured to be read electrically.

4 Claims, 4 Drawing Sheets

(51) Int. Cl.
*H01L 27/092* (2006.01)
*H01L 29/06* (2006.01)
*H01L 29/78* (2006.01)
*G11C 17/16* (2006.01)

(56) References Cited

U.S. PATENT DOCUMENTS

| | | |
|---|---|---|
| 6,304,493 B1 | 10/2001 | Ahn et al. |
| 7,057,926 B2 | 6/2006 | Ohsawa |
| 7,291,519 B2 | 11/2007 | Bhattacharyya |
| 7,609,551 B2 | 10/2009 | Shino et al. |
| 7,700,993 B2 * | 4/2010 | Cai .................. G11C 16/0433 257/313 |
| 7,973,364 B2 | 7/2011 | Krivokapic |
| 8,304,833 B2 | 11/2012 | Mazure et al. |
| 8,530,952 B2 | 9/2013 | El-Kareh |
| 8,735,946 B2 | 5/2014 | Shaheen et al. |
| 9,025,386 B1 | 5/2015 | Iyer et al. |
| 2002/0177260 A1 | 11/2002 | Matsumoto |
| 2006/0125010 A1 | 6/2006 | Bhattacharyya |

OTHER PUBLICATIONS

Frohman-Bentchkowsky, "A Fully Decoded 2048-Bit Electrically Programmable FAMOS Read-Only Memory" IEEE Journal of Solid-State Circuits, col. SC-6, No. 5, Oct. 1971, pp. 301-306.
Ranica et al., "A New 40-nm SONOS Structure Based on Backside Trapping for Nanoscale Memories", IEEE Transactions on Nanotechnology, vol. 4, No. 5, Sep. 2005, pp. 581-587.
Silva et al., "A Nanoscale Memory and Transistor Using Backside Trapping", IEEE Transactions on Nanotechnology, vol. 3, No. 2, Jun. 2004, pp. 264-269.
List of IBM Patents or Patent Applications Treated As Related.

* cited by examiner

ONE TIME PROGRAMMABLE READ-ONLY MEMORY (ROM) IN SOI CMOS

FIELD

The present disclosure relates generally to memory systems employing complementary metal-oxide-semiconductor (CMOS) circuit devices, and particularly, and improved CMOS device on a semiconductor-on-insulator (SOI) substrate structure that is configured for use as a one-time programmable read-only memory.

BACKGROUND

Existing programmable memories consist mostly of field effect transistors with thick floating gate dielectric layers to enable charge storage. The floating gate dielectric layer must be of sufficient thickness, typically greater than 8 nm, to avoid loss of stored charge through the tunneling process. As technology advances, the requirement of thick floating gate dielectric layer may not be compatible with CMOS logic transistor processes because advanced CMOS logic transistors employ relatively thin gate dielectric layers, typically less than 3 nm, for use as floating gate dielectric.

SUMMARY

A one-time programmable read only memory (ROM) in SOI CMOS that achieves charge storage at the buried oxide (BOX) layer while requiring minimum changes in process and design as compared to existing non-volatile memory devices.

In one aspect, an SOI CMOS logic transistor pair (NFET and PFET) is used to form a programmable ROM cell, with the PFET being used as a "memory" storage device enabled by charge injection and storage, and the NFET being used for memory access. Since the charges are injected and stored in the BOX layer (as compared to the floating gate in present charge storage devices), no thick gate dielectric is required, thus making the memory cell structure suitable for integration with CMOS technology nodes.

According to one embodiment, there is provided a method of operating a programmable ROM cell unit having a series coupled CMOS NFET and CMOS PFET device formed on a semiconductor layer located on top of a buried dielectric layer, said buried dielectric layer formed on top of a cell substrate, each NFET and PFET device having a respective gate, drain and source terminals. The method comprises: applying a first bias voltage to said cell substrate; and applying a second bias voltage to a drain terminal of said PFET device with respect to a source of the PFET, said second bias voltage sufficient to enable electron trapping at said buried dielectric layer associated with that cell, said injected electron carriers trapped at said buried dielectric layer providing a stored charge representative of a logic bit value at the unit cell that is physically undetectable and is configured to be read electrically.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. It will also be understood that when an element is referred to as being "connected" or "coupled" to another element, it can be directly connected or coupled to the other element or intervening elements may be present.

Figure 1:
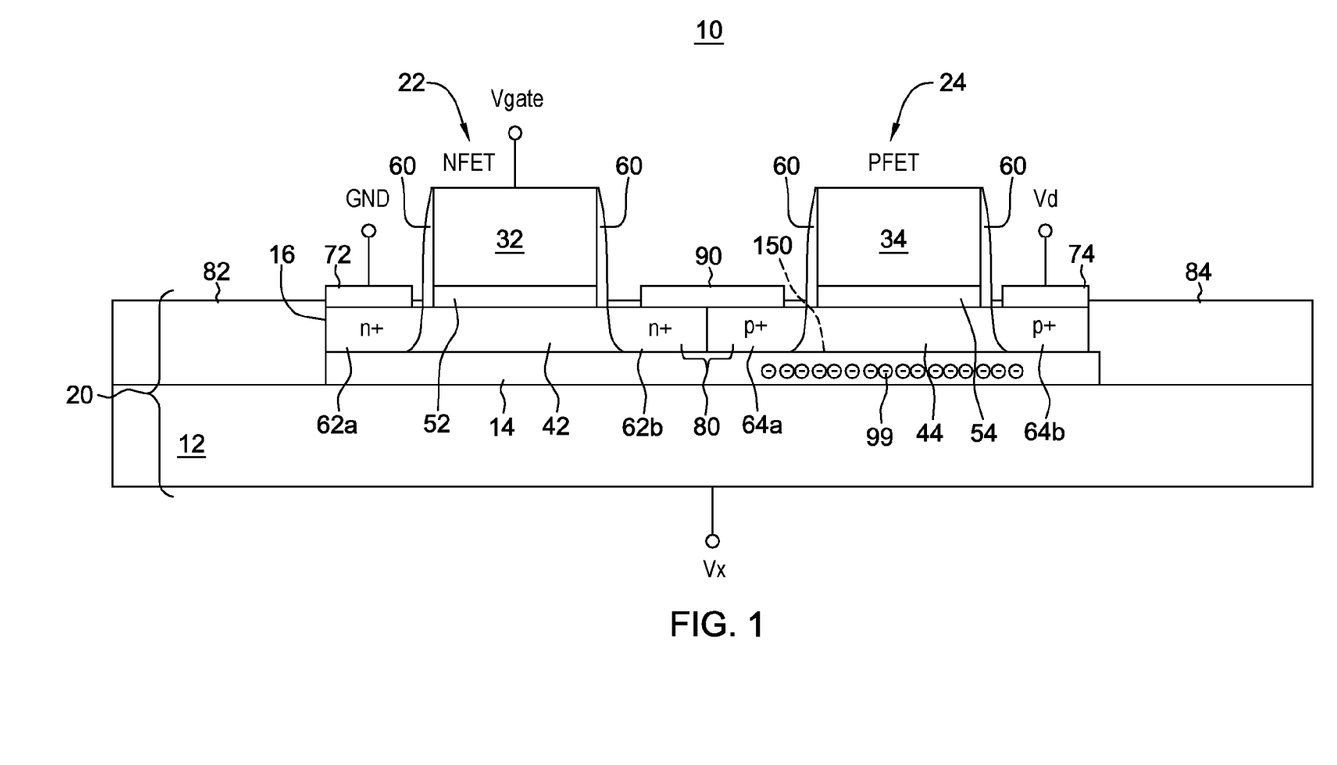
FIG. 1 shows an SOI CMOS ROM memory cell unit according to one embodiment.

FIG. 1 illustrates a programmable read-only memory (ROM) cell 10 according to one embodiment. The structure of ROM memory cell 10 includes two field effect transistors connected in series. Both field effect transistors in the cell structure avoid the requirement of a thick floating gate dielectric layer in order to enable charge storage.

In particular, FIG. 1 shows an SOI CMOS one-time programmable ROM cell structure 10 fabricated according to standard CMOS processes, with an NFET device 22 and a PFET device 24 in series connected or coupled at one common node (e.g., by process, silicidation, and metal level (e.g., M1) wiring). In embodiments, the PFET device 24 can be programmed to store a logic level at the cell in the form of charges 99 stored in the BOX layer 14; however, in other embodiments, the NFET device 22 may be similarly programmed for charge storage. From the structure of FIG. 1 biasing the PFET device 24 enables injection of charge (hot electronic injection) in the BOX, e.g., underlying the PFET device, and the stored charge in the BOX influences whether the PFET is turned on or turned off. That is, the stored charge changes the conductivity of the PFET (or NFET) device channel.

As shown in FIG. 1, the unit cell structure 10 shows at least one CMOS circuit fabricated on a semiconductor-on-insulator (SOI) substrate 20, wherein the at least one CMOS circuit comprises the at least one NFET device 22, e.g., a CMOS logic transistor, coupled to at least one PFET device 24, e.g., another CMOS logic transistor. The SOI substrate 20 includes from the bottom to top, a base semiconductor layer or "handle" substrate 12, an insulator layer such as a buried oxide (BOX) layer 14, and a semiconductor device layer 16, e.g., a layer of Silicon or polysilicon. The CMOS ROM memory cell structure 10 is fabricated on that portion of semiconductor device layer 16 lying directly above the BOX layer 14.

It is noted that in these drawings, which are not drawn to scale, like and/or corresponding elements are referred to by like reference numerals. It is further noted that in the drawings only one CMOS circuit that comprises one NFET and one PFET is shown on an SOI substrate. Although illustration is made to such an embodiment, the present invention is not limited to the formation of any specific number of CMOS circuits, NFETs, and PFETs on the semiconductor substrate.

More particularly, with reference to structure 10 of FIG. 1, base semiconductor layer 12 can include a single crystalline semiconductor material or a polycrystalline semiconductor material. In one embodiment, the base semiconductor layer 12 includes single crystalline semiconductor material. In one embodiment, the base semiconductor layer 12 includes single crystalline silicon. The thickness of the bottom substrate 12 can be from 30 microns to 1 mm, although lesser and greater thicknesses can also be employed.

The insulator layer 14, referred to as BOX, includes a dielectric material. Non-limiting examples of the dielectric material include silicon oxide, $SiO_2$, silicon nitride, silicon oxynitride or a combination thereof. The thickness of the dielectric material layer 14 may be greater than 10 nm although lesser and greater thicknesses can be employed. In one embodiment, the thickness of the insulator layer 14 can be from 10 nm to 500 nm. In another embodiment, the thickness of the insulator layer 14 can be 150 nm+/−50 nm although reduced or increased thicknesses may be used.

In one embodiment, the insulator layer 14 can be formed by depositing a dielectric material on the top surface of the handle substrate 12, for example, by chemical vapor deposition or spin-coating. In another embodiment, at least a top portion of the handle substrate 12 can include a semiconductor material, and the insulator layer 14 can be formed by converting the top portion of the handle substrate 12 into a dielectric material by thermal oxidation, thermal nitridation, plasma oxidation, plasma nitridation, or a combination thereof. In a non-limiting example, the handle substrate 12 can include silicon, and the insulator layer 14 can include silicon oxide formed by oxidation of a top portion of the handle substrate 12. In yet another embodiment, the insulator layer 14 can be formed by a combination of conversion of a top portion of the handle substrate 12 into a dielectric material and deposition of another dielectric material thereupon. In one embodiment, the top surface of the insulator layer is planar, i.e., located within a single horizontal plane.

Further, in view of FIG. 1, semiconductor material layer 16 is grown or bonded to the buried insulator layer 14 such that a surface of the semiconductor material layer 16 contacts a surface of the BOX layer 14. The semiconductor material layer 16 can be bonded to the BOX layer 14 employing any bonding methods known in the art. For example, if the semiconductor material layer 16 includes silicon and if the insulator layer 14 includes silicon oxide, the bonding between the semiconductor material layer 16 and the insulator layer 14 can be performed employing any method for bonding silicon and silicon oxide as known in the art including, but not limited to, an anneal at an elevated temperature and surface activation.

In the formation of the coupled ROM cell structure 10, conventional semiconductor manufacturing techniques are used to dope various portion of the semiconductor material layer. For example, semiconductor material layer 16 can be doped with p-type dopants or n-type dopants to form various semiconductor material portions of the logic transistor NFET 22 or PFET 24, respectively. In one embodiment, a first semiconductor material portion 42 corresponding to a channel of the NFET device 22 can have a doping of the first conductivity type, e.g., p-type, and the second semiconductor material portion 44 corresponding to a channel of the PFET device 24 can have a doping of a second conductivity type, e.g., n-type.

Further, in the formation of the respective logic device NFET 22 and logic device PFET 24, gate stacks are formed over the respective first and second semiconductor material doped portions 42, 44 employing methods known in the art. Logic-type gate stacks can be formed over the first and second semiconductor material portions (42,44) with each gate stack including a thin logic-type gate dielectric 52 formed underneath corresponding NFET gate electrode 32 and a thin logic-type gate dielectric 54 formed underneath corresponding PFET gate electrode 34.

Each of the logic-type gate dielectrics 52, 54 can include any gate dielectric material known in the art including, but not limited to, silicon oxide, silicon nitride, silicon oxynitride, a high-k dielectric, a dielectric metal oxide, a dielectric metal nitride, a dielectric metal oxynitride, or a combination thereof. These logic-type gate dielectrics 52, 54 may, or may not, include the same dielectric material. In one embodiment, a thickness of each logic-type gate dielectric is between 1.0 nm to 3.0 nm although thicknesses greater or less than these thicknesses are contemplated. CMOS logic devices designed for use with a power supply voltage of 1.0 V could have a gate dielectric in the range of 0.8 nm to 1.5 nm. CMOS logic devices designed for use with a power supply voltage of 3.5 V could have a gate dielectric in the range of 3.5 nm to 7.0 nm. In any event, these logic device gate dielectric thicknesses are not large enough for use in floating gate non-volatile memory devices.

In one embodiment, the logic-type gate electrodes 32, 34 can have the same thickness. For example, the logic-type gate electrodes 32, 34 can be formed by deposition of a gate electrode material layer (which can include at least one metallic material and/or at least one semiconductor material), and by patterning and optional dopant implantation of the gate electrode material layer. In this case, the gate electrodes 32, 34 can have the same height. The composition of the gate electrodes 32, 34 may be the same, or may differ only by the concentration of electrical dopants (i.e., p-type dopants and n-type dopants).

In further view of FIG. 1, various source regions, drain regions, and gate spacers 60 can be subsequently formed. As used herein, "source regions" include source extension regions and/or raised source regions as known in the art, and "drain regions" include drain extension regions and/or raised drain regions as known in the art. Various field effect transistors are thus formed.

For example, the formed n-type field effect transistor 22 can include a body region (herein referred to as a channel region 42), a source region (herein referred to as a first source region 62A), a drain region (herein referred to as a first drain region 62B), the gate dielectric 52 overlying the channel 42, and the gate electrode 32 overlying the channel 42. The formed p-type field effect transistor 24 can further include a body region (herein referred to as channel region 44), a source region (herein referred to as a second source region 64A), a drain region (herein referred to as a second drain region 64B), the gate dielectric 54 overlying the channel region 44, and the gate electrode 34 overlying the channel 44.

In the embodiment shown, first drain region 62B and second source region 64A are formed adjacent each other, and given their opposite type conductivities, provide a pn-junction 80. In one embodiment, this p-n junction is shorted together and electrically connected via a metal alloy, e.g., metal silicide 90.

In further view of FIG. 1, formed a top first source region 62A is an electrode structure 72, which may be subsequently employed to electrically connect the field effect transistor 22 to a source voltage, e.g. ground or zero volt, for reading/writing operations. Similarly, formed a top second drain region 64B is an electrode structure 74, which is subsequently employed to electrically bias the field effect transistor 24 with a PFET drain-source voltage when connected to a bitline conductor for unit cell reading/writing operations. These electrode structures, 72, 74 and 90 can be formed by deposition of a metal layer followed by thermal annealing to form a metal silicide, followed by selectively wet etching to remove any unreacted metal.

As further shown in FIG. 1, for enhanced low noise operation, the unit cell comprising the FET transistors 22, 24 are surrounded with shallow trench isolation (STI) structures 82, 84 each structure comprising insulating dielectric material as known in the art, e.g., $SiO_2$. For example, STI structure 82 is formed atop the substrate 12 and abuts the buried oxide layer 14 and first source region 62A at one end of NFET device 22. Similarly, STI structure 84 is formed atop the substrate and abuts the buried oxide layer 14 and second drain region 64B at one end of PFET 24.

As shown in FIG. 1, the coupled logic NFET device 22 and logic PFET device 24 form an SOI CMOS ROM memory cell 10. Charges are not stored at the PFET gate electrode because the gate dielectric layers are too thin for charge storage. That is, only standard CMOS logic processes with minimal or no modifications that can be readily determined by a person ordinarily skilled in the art is used to fabricate the standard technology node logic transistor devices 22, 24 used in the memory unit 10 on a chip.

In one embodiment, the PFET device 24 of the series connected transistor devices 22, 24 of the SOI CMOS cell 10 is used as the "memory" device enabled by charge injection and storage, and the NFET device 22 of the SOI CMOS is used for memory access. By applying certain biasing conditions, hot electrons are injected into the BOX under the PFET 24. Since the charges (hot carriers) 99 are injected and stored in the BOX layer 14 (as compared to the floating gate in present charge storage devices), no thick gate dielectric is required, and the cell structure 10 is suitable for integration with current technology nodes.

In one example implementation, by biasing the substrate with a voltage Vx, such as by a grounding voltage or by applying a positive voltage (e.g., Vx>0V), e.g., 10V, 20V or 30 V (with respect to ground potential), and additionally by applying a bias voltage Vds across the PFET 24, e.g., Vds≥2V, there is induced avalanche hot electron injections into the BOX layer 14 under PFET 24. For example, with the substrate voltage Vx>0V, and Vds≥2V applied across the PFET, there is enabled effective electron trapping in the BOX layer 14. This effectively creates a logic level, e.g., a logic bit value 1 or 0, to be stored and subsequently read out of the cell 10. In one embodiment, the NFET device 22 functions as the switch to read the data stored in the BOX layer 14 under PFET 24 via the hot carrier injection.

Figure 2:
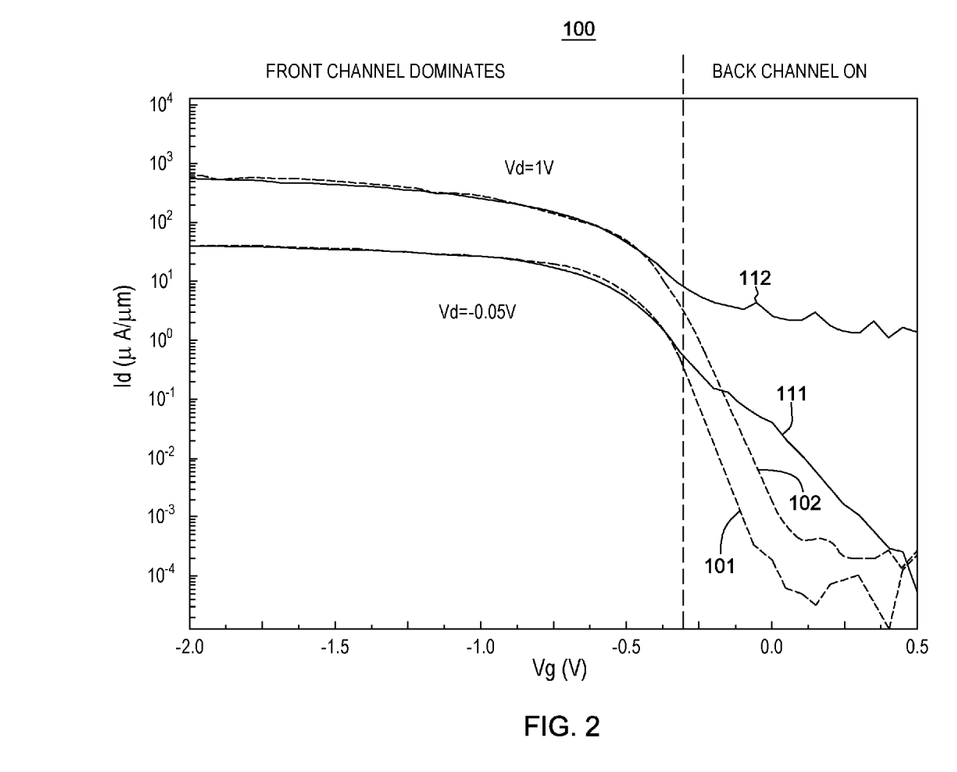
FIG. 2 shows I-V response curves for an SOI CMOS ROM memory cell according to an embodiment.

FIG. 2 shows an example plot 100 of Id-Vg curves exhibited at an example SOI CMOS ROM memory cell 10 of FIG. 1. In the plot 100 "regular" Id-Vg response curves are shown taken before and after hot carrier injection into the BOX layer 14 under PFET 24 of the SOI CMOS memory cell 10. The electrical data depicted in the plot 100 show curves plotted as a function of drain current (Id) (on the Y-Axis) versus a gate voltage Vg (on the X-Axis) at the gate of the PFET for different Vds values applied at the PFET. The gate of the PFET refers to the gate electrode 34 of the PFET 24 shown in FIG. 1. That is, plot 100 shows the drain current versus gate voltage of a PFET measured in a manner known to skilled artisans, with the source of the PFET at ground, a gate voltage applied to the gate electrode of the PFET, and a drain-to-source voltage Vds applied to the drain of the PFET. For example, curve 101 depicts a response of the PFET prior to initiating hot carrier injection into the BOX at a first Vds value at the PFET of about −0.05 volts. Similarly, curve 102 depicts a response of the PFET prior to initiating hot carrier (electrons) injection into the BOX layer at an increased Vds value at the PFET of about −1.0 volts. As seen in FIG. 2, prior to hot carrier injection, at the lower Vg biasing condition, the front channel of the PFET device dominates (exhibits normal PFET channel behavior) as there is no appreciable charge storage in the BOX layer 14, and thus no induced back channel 150 (see FIG. 1) at the interface between the PFET channel region and the BOX layer at the PFET.

Further in the example plot 100 of FIG. 2, a curve 111 depicts an Id-Vg response of the PFET after initiating hot carrier injection into the BOX while the PFET is biased at the same Vds value of about −0.05 volts. In this case, the injection of hot electrons into the BOX was initiated by grounding the source and applying a voltage at the drain of the PFET, e.g., −3.0 volts to the drain of the PFET, while the substrate was biased with a Vx voltage of 30 volts. Some of the hot electrons thus injected into the BOX beneath the PFET were trapped inside the BOX. The trapped electrons caused an accumulation of holes in the PFET near the BOX layer 14. That is, the hot electrons injected into the BOX beneath the PFET effectively turn on the PFET "back channel" 150 by inducing an accumulation of charges (holes) formed at the BOX layer 14. In this embodiment, the trapped electrons are negative, which induce an accumulation of holes which are positive. With the back channel 150 turned on after hot electron injection, the measured Id-Vg curve 111 shows larger drain current compared to Id-Vg curve 101 measured before any hot electron injection. It is understood in this scenario, to induce hot carrier injection, the substrate layer may be biased with a Vx voltage, e.g., 30 volts. This results in an increased conduction at the back channel and increased amount of Id (PFET drain current) after the additional charge storage at the back channel 150. This additional charge storage is representative of a stored logic bit value at the unit cell.

Similarly, curve 112 depicts a response of the PFET 24 after initiating hot carrier (electrons) injection into the BOX layer while the PFET is biased at the same Vds value of about −1.0 volts. Curve 112 was measured after hot electrons were injected into and trapped in the BOX beneath the PFET thus inducing an accumulation of charges (holes) in the back channel 150 in the PFET channel region at the interface of BOX layer 14. This results in an increased amount of Id (PFET drain current) compared to curve 102 given the additional current due to the induced holes at the back channel 150.

Thus, as seen, prior to hot carrier injection there is no appreciable charge storage at the BOX layer 14, and thus no induced back channel at the PFET. Thus, it can be considered that the PFET is in an unprogrammed state. As a result of hot carrier injection, the PFET becomes programmed with the appreciable charge storage at the BOX layer 14 sufficient to correspond to a logic level, e.g., a bit value, which can be discriminated when read out of the PFET when subject to a read operation.

Using an array of cell structures 10 of FIG. 1 in a microprocessor, for example, it is possible to provide non-detectable, non-volatile memory elements (unit cells 10) on the chip which can be programmed in a non-detectable manner. There is no memory component that can be reverse engineered, and such SOI ROM unit cells provide more secure storage of memory. For example, an array of SOI CMOS ROM cells with PFET hot carrier injection into the BOX may each be programmed to store a built-in (embedded) undetectable encryption key. The stored logic bits can be "read" electrically in ROM operation, but the PFET is physically non-distinguishable from other PFETs on the logic chip.

Figure 3:
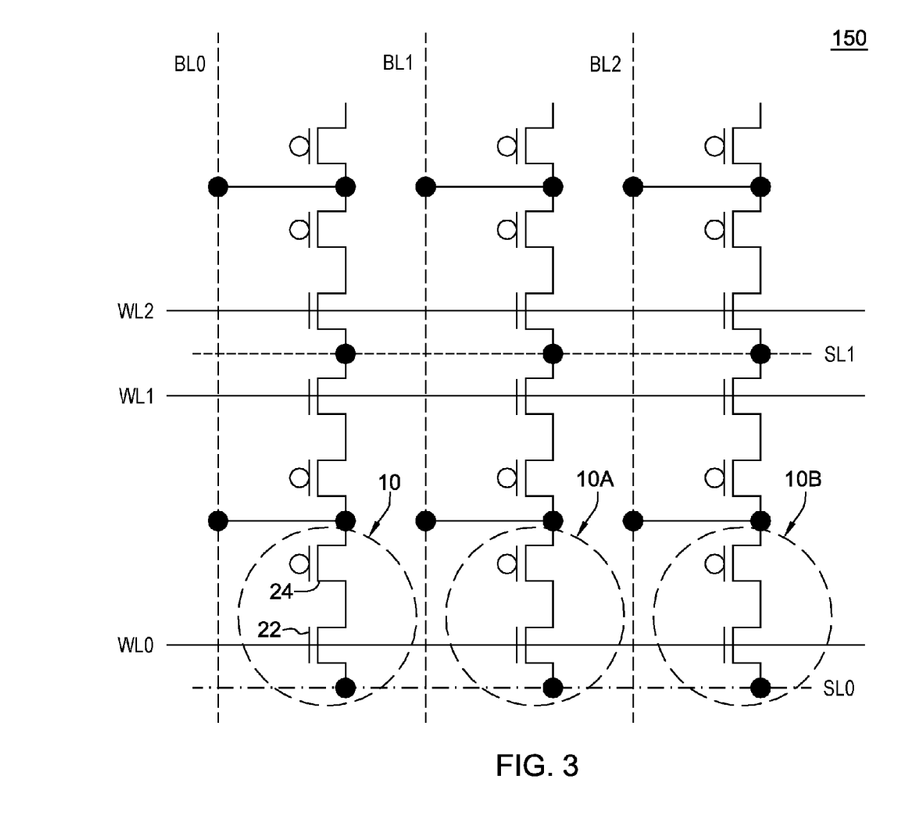
FIG. 3 shows an array of SOI CMOS ROM storage devices according to an embodiment.

FIG. 3 shows such a portion of an SOI ROM memory array 150 comprising unit cells 10 configured to store multiple bits. In one embodiment, the array 150 is configured for storing as undetectable bits, a private encryption key in the SOI CMOS unit cells 10. This ROM array 150 is built using SOI CMOS fabrication techniques and implements PFET hot carrier injection in the BOX for memory storage.

In particular, FIG. 3 shows an array of plural unit ROM cells 10, a plurality of wordline conductors WL0, WL1, WL2, etc. each for activating one or more cells 10 attached thereto, and plurality of bitline conductors BL0, BL1, BL2, etc., connected to respective drain terminals of the respective PFET devices of a corresponding cell.

In view of FIGS. 1 and 3, each wordline conductor, e.g., WL0, WL1, WL2, etc. is shown connected to a respective row of unit ROM cells 10, with the WL0 connected to each respective gate of an NFET on each row. Additionally, the source region of the unit ROM cell NFET is shown connected to a source line, e.g., a line referred to as SL0. In one embodiment, the source lines S0, S1, etc. are configured to provide an electrical ground voltage as shown in FIG. 1 at NFET source electrode 72. The p-n junction that is shorted together by metal alloy 90 is floating, and no output is read at this node. Further, each bitline conductor, e.g., BL0, BL1, BL2, etc. is shown connected to a respective column of unit ROM cells 10 at each respective cell's PFET drain electrode Vd of the column for reading and writing bit values for storage at a wordline selected cell.

Figure 4:
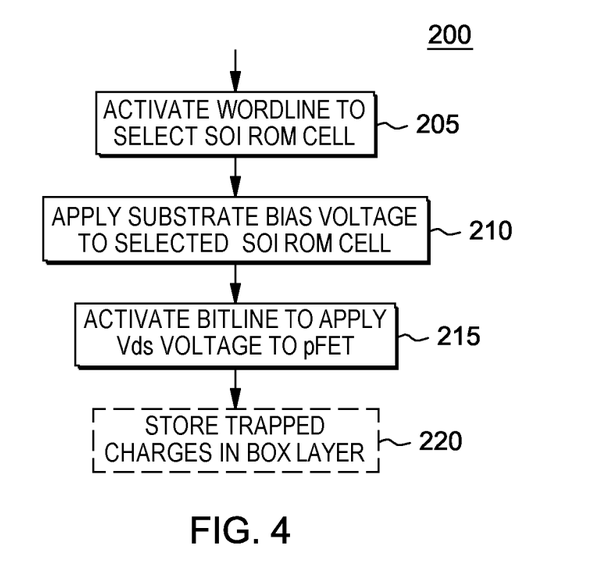
FIG. 4 shows an exemplary method of programming an SOI CMOS ROM storage device.

FIG. 4 shows a method 200 of programming a bit in a bit cell of the SOI ROM cell array 150 of FIG. 3. In one embodiment, at a first step 205, there is activated an SOI ROM cell to which a logic bit is to be written. This involves activating a selected wordline, e.g., WL0, by applying, in one embodiment, a voltage equal to the CMOS chip power supply voltage (Vdd) to the gate of the NFET to turn on the NFET device. Having selected a unit cell via activated wordline, at 210, there is applied a bias voltage Vx to the substrate (e.g., ground or a positive voltage potential) of that cell. At 215, FIG. 4, to set up the bias condition for hot carrier (electron) injection at the PFET, the corresponding bitline, e.g., BL0, coupled to the drain of the PFET, is activated and a source-to-drain voltage Vds is applied to the PFET. Subject to these biasing conditions, the unit cell 10 stores trapped charges (electrons) at the underlying BOX layer at 220 representative of a desired logic value for storage at the cell. This process of causing electrons to be trapped causes the device to behave as a memory cell whose read/write logic state is not detectable physically.

Thus, for example, to write to a unit cell 10 (e.g. to store a bit at (0,0)), the SOI substrate is subject to a positive voltage, e.g., +10 V, and is subject to a worldline voltage $V_{WL0} > 0$ (e.g., worldline voltage typically equal to the CMOS chip power supply voltage Vdd) being applied to the wordline conductor WL0 to select that cell. For example, for the case of leading-edge CMOS, the WL0 voltage applied may be +1.0 volts in order to select the cell. Then the bitline BL0 connected to the selected cell is activated by applying a further positive voltage, e.g., +3.0 volts thereon, which bias conditions are sufficient to inject hot electrons into the BOX under the PFET (i.e., trapped electrons in the BOX turn on the back channel of the PFET).

It is understood that, although a voltage is applied to the BL conductor, any non-selected cells connected to that bitline are not written because the +3 V is divided across both the NFET and the PFET, resulting in Vds across the PFET being too small to cause hot electron injection.

While embodiments herein depict programming of a single SOI CMOS ROM cell, it is understood that multiple bits of the SOI CMOS ROM cell array 150 may be programmed in at iterative fashion, e.g., one at a time, or at the same time. For example, as shown in FIG. 3, activating a WL0 may function to select all unit cells connected to that wordline, i.e., cells 10, 10A, 10B and by simultaneously applying a bias conditions to the substrate of each cell, i.e., cells 10, 10A, 10B, and applying a bit line voltage to each corresponding bitline (e.g., BL0, BL1, BL2), multiple bits may be written simultaneously to respective cells 10, 10A, 10B.

In view of the array structure of FIG. 3, activation of a word line, e.g., WL0, to select a unit cell enables charges stored at the BOX layer of that unit cell 10 to be detected at a respective bitline, e.g., BL0, BL1, BL2, etc. That is, detection of a stored charge (bit) at the back channel BOX trapping layer is accomplished via current or voltage conducted via a bit line. Thus, to read or detect a bit at a bitline requires first selecting the unit cell 10 by activating a wordline, e.g., WL0, and detecting or conducting a charge or current at the PFET device of cell 10 by reading a current at a bitline, e.g., BL0.

Figure 5:
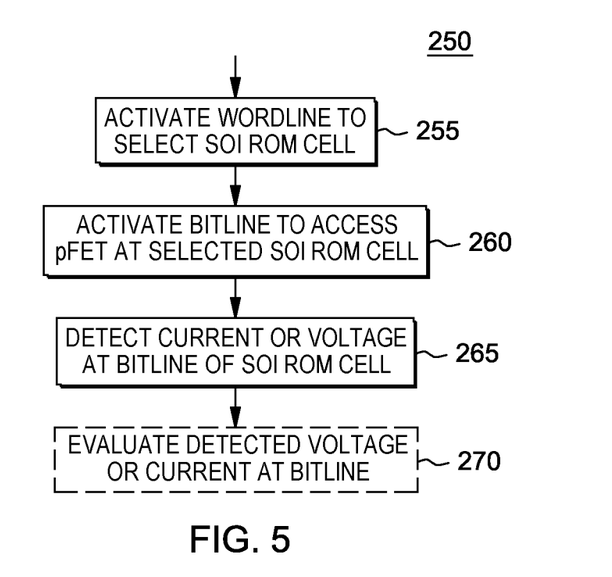
FIG. 5 shows an exemplary method of accessing a logic value of a bit programmed into an SOI CMOS ROM storage device.

FIG. 5 shows a method 250 of reading a stored logic value at the one-time programmable ROM memory cell.

To read a bit at a cell, there is first activated the SOI ROM cell to which a logic bit is to be read. This involves activating at 255, FIG. 5, a selected wordline, e.g., WL0, by applying a voltage, e.g., +1.0 Volts to the gate of the NFET device of the selected cell 10, thereby turning on the NFET 22 and placing the NFET to ground as the source region side of the PFET is shorted to signal line (SL0) thus pulling the PFET to ground. Then, at 265, the stored value may be read via a bitline.

That is, at 265, via the bitline, e.g., BL0, a sensing device (not shown) may detect how much current the PFET of that cell is carrying. This is accomplished by first activating the bitline at 260, e.g., BL0, by applying +1.0 V at BL0, such that the PFET drain current can be read at 265. The conduction of more current or less current depends upon the amount of charge stored at the BOX layer underlying the PFET and that amount of current can be used to determine a logic value stored at that cell. Thus, at 270, FIG. 5, a logic value may be detected at the bitline. For example, a sensed low current value may be indicative of no trapped charges (no back channel induced) and correspond to a logic 0, while a sensed current value at the cell that is significantly increased may be indicative of the presence of the additional trapped charges (back channel induced) and correspond to a stored logic 1 level.

While embodiments herein depict reading of a single SOI CMOS ROM cell, it is understood that multiple bits of the SOI CMOS ROM cell array 150 may be detected in an iterative fashion, e.g., one at a time, or at the same time. For example, as shown in FIG. 3, activating a WL0 may function to select all unit cells connected to that word line, i.e., cells 10, 10A, 10B, and applying a bit line voltage to each corresponding bitline (e.g., BL0, BL1, BL2), multiple bit values may be read simultaneously at respective cells 10, 10A, 10B.

While FIG. 3 shows an example 3×3 programmable memory device array circuit 150 which depicts the presence of the PFET trapping cell for hot carrier injection into the BOX, in particular, the present devices and structures can be implemented in any memory device array structure requiring a one-time programmable setting operation.

While FIGS. 1 and 3 illustratively demonstrate exemplary SOI-CMOS ROM structures, according to specific embodiments of the present invention, it is clear that a person ordinarily skilled in the art can readily modify the device structure and the process steps illustrated herein, for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method of operating a programmable ROM cell unit having a series coupled CMOS NFET and CMOS PFET device formed on a semiconductor layer located on top of a buried dielectric layer, said buried dielectric layer formed on top of a cell substrate, each NFET and PFET device having a respective gate, drain and source terminals, said method comprising:

applying a first bias voltage to said cell substrate; and applying a second bias voltage to a drain terminal of said PFET device with respect to a source of the PFET, said second bias voltage sufficient to enable injecting of electrons and trapping of said injected electrons at said buried dielectric layer beneath said PFET associated with that cell, and responsively inducing accumulation of holes at a back channel of said PFET device comprising an interface between a PFET device channel beneath a gate of said PFET and said buried dielectric layer, said injected electron carriers trapped at said buried dielectric layer providing a stored charge representative of a logic bit value at the unit cell that is physically undetectable and is configured to be read electrically.

2. The method of claim 1, further comprising:

applying an additional bias voltage to a gate terminal of said NFET device to activate said NFET device to read the charge stored at said buried oxide layer as a PFET drain current.

3. The method of claim 1, wherein a gate of said PFET device is floating during said applying of said first and second bias voltages.

4. The method of claim 1, further comprising: prior to said applying said first bias voltage and prior to applying said second bias voltage, selecting a ROM cell for charge storage thereat.

* * * * *